United States Patent
Liu et al.

(10) Patent No.: US 9,822,441 B2
(45) Date of Patent: Nov. 21, 2017

(54) IRIDIUM UNDERLAYER FOR HEAT ASSISTED MAGNETIC RECORDING MEDIA

(71) Applicant: WD Media, LLC, San Jose, CA (US)

(72) Inventors: Jiaxing Liu, New York, NY (US); Tomoko Seki, Sunnyvale, CA (US); Antony Ajan, San Jose, CA (US); Rui Zhang, Milpitas, CA (US)

(73) Assignee: WD Media, LLC, San Jose, CA (US)

(*) Notice: Subject to any disclaimer, the term of this patent is extended or adjusted under 35 U.S.C. 154(b) by 275 days.

(21) Appl. No.: 14/674,185

(22) Filed: Mar. 31, 2015

(65) Prior Publication Data
US 2016/0293195 A1    Oct. 6, 2016

(51) Int. Cl.
| G11B 5/66 | (2006.01) |
| C23C 14/34 | (2006.01) |
| G11B 5/65 | (2006.01) |
| G11B 5/72 | (2006.01) |
| G11B 5/73 | (2006.01) |
| G11B 5/00 | (2006.01) |

(52) U.S. Cl.
CPC .............. *C23C 14/34* (2013.01); *G11B 5/653* (2013.01); *G11B 5/72* (2013.01); *G11B 5/7315* (2013.01); *G11B 5/7325* (2013.01); *G11B 2005/0021* (2013.01)

(58) Field of Classification Search
CPC ............................................. G11B 2005/0021
See application file for complete search history.

(56) References Cited

U.S. PATENT DOCUMENTS

| 6,013,161 A | 1/2000 | Chen et al. |
| 6,063,248 A | 5/2000 | Bourez et al. |
| 6,068,891 A | 5/2000 | O'Dell et al. |

(Continued)

FOREIGN PATENT DOCUMENTS

| JP | 2003085702 | 3/2003 |
| JP | 2011060344 | 3/2011 |
| WO | 2008030199 A1 | 3/2008 |

OTHER PUBLICATIONS

Hua Yuan, et al., U.S. Appl. No. 13/206,071, filed Aug. 9, 2011, 31 pages.

(Continued)

*Primary Examiner* — Holly Rickman
(74) *Attorney, Agent, or Firm* — Foley & Lardner LLP

(57) ABSTRACT

A heat-assisted magnetic recording (HAMR) media stack is provided in which Iridium (Ir)-based materials may be utilized as a secondary underlayer instead of a Magnesium Oxide (MgO) underlayer utilized in conventional media stacks. Such Ir-based materials may include, e.g., pure Ir, Ir-based alloys, Ir-based compounds, as well as a granular Ir layer with segregants. The use of Ir or Ir-based materials as an underlayer provide advantages over the use of MgO as an underlayer. For example, DC sputtering can be utilized to deposit the layers of the media stack, where the deposition rate of Ir is considerably higher than that of MgO resulting in higher manufacturing production yields. Further still, less particles are generated during Ir-based layer deposition processes, and Ir-based underlayer can act as a better heat sink. Further still, the morphology and structure of a recording layer deposited on an Ir-based layer can be better controlled.

20 Claims, 10 Drawing Sheets

(56) References Cited

U.S. PATENT DOCUMENTS

| | | |
|---|---|---|
| 6,086,730 A | 7/2000 | Liu et al. |
| 6,099,981 A | 8/2000 | Nishimori |
| 6,103,404 A | 8/2000 | Ross et al. |
| 6,117,499 A | 9/2000 | Wong et al. |
| 6,136,403 A | 10/2000 | Prabhakara et al. |
| 6,143,375 A | 11/2000 | Ross et al. |
| 6,145,849 A | 11/2000 | Bae et al. |
| 6,146,737 A | 11/2000 | Malhotra et al. |
| 6,149,696 A | 11/2000 | Jia |
| 6,150,015 A | 11/2000 | Bertero et al. |
| 6,156,404 A | 12/2000 | Ross et al. |
| 6,159,076 A | 12/2000 | Sun et al. |
| 6,164,118 A | 12/2000 | Suzuki et al. |
| 6,200,441 B1 | 3/2001 | Gornicki et al. |
| 6,204,995 B1 | 3/2001 | Hokkyo et al. |
| 6,206,765 B1 | 3/2001 | Sanders et al. |
| 6,210,819 B1 | 4/2001 | Lal et al. |
| 6,216,709 B1 | 4/2001 | Fung et al. |
| 6,221,119 B1 | 4/2001 | Homola |
| 6,248,395 B1 | 6/2001 | Homola et al. |
| 6,261,681 B1 | 7/2001 | Suekane et al. |
| 6,270,885 B1 | 8/2001 | Hokkyo et al. |
| 6,274,063 B1 | 8/2001 | Li et al. |
| 6,283,838 B1 | 9/2001 | Blake et al. |
| 6,287,429 B1 | 9/2001 | Moroishi et al. |
| 6,290,573 B1 | 9/2001 | Suzuki |
| 6,299,947 B1 | 10/2001 | Suzuki et al. |
| 6,303,217 B1 | 10/2001 | Malhotra et al. |
| 6,309,765 B1 | 10/2001 | Suekane et al. |
| 6,358,636 B1 | 3/2002 | Yang et al. |
| 6,362,452 B1 | 3/2002 | Suzuki et al. |
| 6,363,599 B1 | 4/2002 | Bajorek |
| 6,365,012 B1 | 4/2002 | Sato et al. |
| 6,381,090 B1 | 4/2002 | Suzuki et al. |
| 6,381,092 B1 | 4/2002 | Suzuki |
| 6,387,483 B1 | 5/2002 | Hokkyo et al. |
| 6,391,213 B1 | 5/2002 | Homola |
| 6,395,349 B1 | 5/2002 | Salamon |
| 6,403,919 B1 | 6/2002 | Salamon |
| 6,408,677 B1 | 6/2002 | Suzuki |
| 6,426,157 B1 | 7/2002 | Hokkyo et al. |
| 6,429,984 B1 | 8/2002 | Alex |
| 6,482,330 B1 | 11/2002 | Bajorek |
| 6,482,505 B1 | 11/2002 | Bertero et al. |
| 6,500,567 B1 | 12/2002 | Bertero et al. |
| 6,528,124 B1 | 3/2003 | Nguyen |
| 6,548,821 B1 | 4/2003 | Treves et al. |
| 6,552,871 B2 | 4/2003 | Suzuki et al. |
| 6,565,719 B1 | 5/2003 | Lairson et al. |
| 6,566,674 B1 | 5/2003 | Treves et al. |
| 6,571,806 B2 | 6/2003 | Rosano et al. |
| 6,628,466 B2 | 9/2003 | Alex |
| 6,664,503 B1 | 12/2003 | Hsieh et al. |
| 6,670,055 B2 | 12/2003 | Tomiyasu et al. |
| 6,682,807 B2 | 1/2004 | Lairson et al. |
| 6,683,754 B2 | 1/2004 | Suzuki et al. |
| 6,730,420 B1 | 5/2004 | Bertero et al. |
| 6,743,528 B2 | 6/2004 | Suekane et al. |
| 6,759,138 B2 | 7/2004 | Tomiyasu et al. |
| 6,778,353 B1 | 8/2004 | Harper |
| 6,795,274 B1 | 9/2004 | Hsieh et al. |
| 6,855,232 B2 | 2/2005 | Jairson et al. |
| 6,857,937 B2 | 2/2005 | Bajorek |
| 6,893,748 B2 | 5/2005 | Bertero et al. |
| 6,899,959 B2 | 5/2005 | Bertero et al. |
| 6,916,558 B2 | 7/2005 | Umezawa et al. |
| 6,939,120 B1 | 9/2005 | Harper |
| 6,946,191 B2 | 9/2005 | Morikawa et al. |
| 6,967,798 B2 | 11/2005 | Homola et al. |
| 6,972,135 B2 | 12/2005 | Homola |
| 7,004,827 B1 | 2/2006 | Suzuki et al. |
| 7,006,323 B1 | 2/2006 | Suzuki |
| 7,016,154 B2 | 3/2006 | Nishihira |
| 7,019,924 B2 | 3/2006 | McNeil et al. |
| 7,045,215 B2 | 5/2006 | Shimokawa |
| 7,070,870 B2 | 7/2006 | Bertero et al. |
| 7,090,934 B2 | 8/2006 | Hokkyo et al. |
| 7,099,112 B1 | 8/2006 | Harper |
| 7,105,241 B2 | 9/2006 | Shimokawa et al. |
| 7,119,990 B2 | 10/2006 | Bajorek et al. |
| 7,147,790 B2 | 12/2006 | Wachenschwanz et al. |
| 7,161,753 B2 | 1/2007 | Wachenschwanz et al. |
| 7,166,319 B2 | 1/2007 | Ishiyama |
| 7,166,374 B2 | 1/2007 | Suekane et al. |
| 7,169,487 B2 | 1/2007 | Kawai et al. |
| 7,174,775 B2 | 2/2007 | Ishiyama |
| 7,179,549 B2 | 2/2007 | Malhotra et al. |
| 7,184,139 B2 | 2/2007 | Treves et al. |
| 7,195,827 B2 | 3/2007 | Maeda et al. |
| 7,196,860 B2 | 3/2007 | Alex |
| 7,199,977 B2 | 4/2007 | Suzuki et al. |
| 7,208,236 B2 | 4/2007 | Morikawa et al. |
| 7,220,500 B1 | 5/2007 | Tomiyasu et al. |
| 7,229,266 B2 | 6/2007 | Harper |
| 7,239,970 B2 | 7/2007 | Treves et al. |
| 7,252,897 B2 | 8/2007 | Shimokawa et al. |
| 7,277,254 B2 | 10/2007 | Shimokawa et al. |
| 7,281,920 B2 | 10/2007 | Homola et al. |
| 7,292,329 B2 | 11/2007 | Treves et al. |
| 7,301,726 B1 | 11/2007 | Suzuki |
| 7,302,148 B2 | 11/2007 | Treves et al. |
| 7,305,119 B2 | 12/2007 | Treves et al. |
| 7,314,404 B2 | 1/2008 | Singh et al. |
| 7,320,584 B1 | 1/2008 | Harper et al. |
| 7,329,114 B2 | 2/2008 | Harper et al. |
| 7,375,362 B2 | 5/2008 | Treves et al. |
| 7,420,886 B2 | 9/2008 | Tomiyasu et al. |
| 7,425,719 B2 | 9/2008 | Treves et al. |
| 7,471,484 B2 | 12/2008 | Wachenschwanz et al. |
| 7,498,062 B2 | 3/2009 | Calcaterra et al. |
| 7,521,137 B2 | 4/2009 | Hohlfeld et al. |
| 7,531,485 B2 | 5/2009 | Hara et al. |
| 7,537,846 B2 | 5/2009 | Ishiyama et al. |
| 7,549,209 B2 | 6/2009 | Wachenschwanz et al. |
| 7,569,490 B2 | 8/2009 | Staud |
| 7,597,792 B2 | 10/2009 | Homola et al. |
| 7,597,973 B2 | 10/2009 | Ishiyama |
| 7,608,193 B2 | 10/2009 | Wachenschwanz et al. |
| 7,632,087 B2 | 12/2009 | Homola |
| 7,656,615 B2 | 2/2010 | Wachenschwanz et al. |
| 7,682,546 B2 | 3/2010 | Harper |
| 7,684,152 B2 | 3/2010 | Suzuki et al. |
| 7,686,606 B2 | 3/2010 | Harper et al. |
| 7,686,991 B2 | 3/2010 | Harper |
| 7,695,833 B2 | 4/2010 | Ishiyama |
| 7,722,968 B2 | 5/2010 | Ishiyama |
| 7,733,605 B2 | 6/2010 | Suzuki et al. |
| 7,736,768 B2 | 6/2010 | Ishiyama |
| 7,755,861 B1 | 7/2010 | Li et al. |
| 7,758,732 B1 | 7/2010 | Calcaterra et al. |
| 7,833,639 B2 | 11/2010 | Sonobe et al. |
| 7,833,641 B2 | 11/2010 | Tomiyasu et al. |
| 7,862,914 B2 | 1/2011 | Kubota et al. |
| 7,910,159 B2 | 3/2011 | Jung |
| 7,911,736 B2 | 3/2011 | Bajorek |
| 7,924,519 B2 | 4/2011 | Lambert |
| 7,944,165 B1 | 5/2011 | O'Dell |
| 7,944,643 B1 | 5/2011 | Jiang et al. |
| 7,955,723 B2 | 6/2011 | Umezawa et al. |
| 7,983,003 B2 | 7/2011 | Sonobe et al. |
| 7,993,497 B2 | 8/2011 | Moroishi et al. |
| 7,993,764 B2 * | 8/2011 | Takenoiri ............ G11B 5/7325 427/131 |
| 7,993,765 B2 | 8/2011 | Kim et al. |
| 7,998,912 B2 | 8/2011 | Chen et al. |
| 8,002,901 B1 | 8/2011 | Chen et al. |
| 8,003,237 B2 | 8/2011 | Sonobe et al. |
| 8,012,920 B2 | 9/2011 | Shimokawa |
| 8,038,863 B2 | 10/2011 | Homola |
| 8,057,926 B2 | 11/2011 | Ayama et al. |
| 8,062,778 B2 | 11/2011 | Suzuki et al. |
| 8,064,156 B1 | 11/2011 | Suzuki et al. |
| 8,076,013 B2 | 12/2011 | Sonobe et al. |
| 8,092,931 B2 | 1/2012 | Ishiyama et al. |

(56) References Cited

U.S. PATENT DOCUMENTS

| | | |
|---|---|---|
| 8,100,685 B1 | 1/2012 | Harper et al. |
| 8,101,054 B2 | 1/2012 | Chen et al. |
| 8,125,723 B1 | 2/2012 | Nichols et al. |
| 8,125,724 B1 | 2/2012 | Nichols et al. |
| 8,137,517 B1 | 3/2012 | Bourez |
| 8,142,916 B2 | 3/2012 | Umezawa et al. |
| 8,163,093 B1 | 4/2012 | Chen et al. |
| 8,171,949 B1 | 5/2012 | Lund et al. |
| 8,173,282 B1 | 5/2012 | Sun et al. |
| 8,178,480 B2 | 5/2012 | Hamakubo et al. |
| 8,206,789 B2 | 6/2012 | Suzuki |
| 8,218,260 B2 | 7/2012 | Iamratanakul et al. |
| 8,247,095 B2 | 8/2012 | Champion et al. |
| 8,257,783 B2 | 9/2012 | Suzuki et al. |
| 8,279,739 B2 | 10/2012 | Kanbe et al. |
| 8,298,609 B1 | 10/2012 | Liew et al. |
| 8,298,689 B2 | 10/2012 | Sonobe et al. |
| 8,309,239 B2 | 11/2012 | Umezawa et al. |
| 8,316,668 B1 | 11/2012 | Chan et al. |
| 8,331,056 B2 | 12/2012 | O'Dell |
| 8,351,309 B2 | 1/2013 | Kanbe et al. |
| 8,354,618 B1 | 1/2013 | Chen et al. |
| 8,367,228 B2 | 2/2013 | Sonobe et al. |
| 8,383,209 B2 | 2/2013 | Ayama |
| 8,394,243 B1 | 3/2013 | Jung et al. |
| 8,397,751 B1 | 3/2013 | Chan et al. |
| 8,399,809 B1 | 3/2013 | Bourez |
| 8,402,638 B1 | 3/2013 | Treves et al. |
| 8,404,056 B1 | 3/2013 | Chen et al. |
| 8,404,369 B2 | 3/2013 | Ruffini et al. |
| 8,404,370 B2 | 3/2013 | Sato et al. |
| 8,406,918 B2 | 3/2013 | Tan et al. |
| 8,414,966 B2 | 4/2013 | Yasumori et al. |
| 8,425,975 B2 | 4/2013 | Ishiyama |
| 8,431,257 B2 | 4/2013 | Kim et al. |
| 8,431,258 B2 | 4/2013 | Onoue et al. |
| 8,453,315 B2 | 6/2013 | Kajiwara et al. |
| 8,488,276 B1 | 7/2013 | Jung et al. |
| 8,491,800 B1 | 7/2013 | Dorsey |
| 8,492,009 B1 | 7/2013 | Homola et al. |
| 8,492,011 B2 | 7/2013 | Itoh et al. |
| 8,496,466 B1 | 7/2013 | Treves et al. |
| 8,509,039 B1 | 8/2013 | Huang et al. |
| 8,517,364 B1 | 8/2013 | Crumley et al. |
| 8,517,657 B2 | 8/2013 | Chen et al. |
| 8,524,052 B1 | 9/2013 | Tan et al. |
| 8,530,065 B1 | 9/2013 | Chernyshov et al. |
| 8,546,000 B2 | 10/2013 | Umezawa |
| 8,551,253 B2 | 10/2013 | Na'im et al. |
| 8,551,627 B2 | 10/2013 | Shimada et al. |
| 8,556,566 B1 | 10/2013 | Suzuki et al. |
| 8,559,131 B2 | 10/2013 | Masuda et al. |
| 8,562,748 B1 | 10/2013 | Chen et al. |
| 8,565,050 B1 | 10/2013 | Bertero et al. |
| 8,570,844 B1 | 10/2013 | Yuan et al. |
| 8,580,410 B2 | 11/2013 | Onoue |
| 8,584,687 B1 | 11/2013 | Chen et al. |
| 8,591,709 B1 | 11/2013 | Lim et al. |
| 8,592,061 B2 | 11/2013 | Onoue et al. |
| 8,596,287 B1 | 12/2013 | Chen et al. |
| 8,597,723 B1 | 12/2013 | Jung et al. |
| 8,603,649 B2 | 12/2013 | Onoue |
| 8,603,650 B2 | 12/2013 | Sonobe et al. |
| 8,605,388 B2 | 12/2013 | Yasumori et al. |
| 8,605,555 B1 | 12/2013 | Chernyshov et al. |
| 8,608,147 B1 | 12/2013 | Yap et al. |
| 8,609,263 B1 | 12/2013 | Chernyshov et al. |
| 8,619,381 B2 | 12/2013 | Moser et al. |
| 8,623,528 B2 | 1/2014 | Umezawa et al. |
| 8,623,529 B2 | 1/2014 | Suzuki |
| 8,634,155 B2 | 1/2014 | Yasumori et al. |
| 8,658,003 B1 | 2/2014 | Bourez |
| 8,658,292 B1 | 2/2014 | Mallary et al. |
| 8,665,541 B2 | 3/2014 | Saito |
| 8,668,953 B1 | 3/2014 | Buechel-Rimmel |
| 8,674,327 B1 | 3/2014 | Poon et al. |
| 8,685,214 B1 | 4/2014 | Moh et al. |
| 8,696,404 B2 | 4/2014 | Sun et al. |
| 8,703,308 B2 | 4/2014 | Maeda |
| 8,711,499 B1 | 4/2014 | Desai et al. |
| 8,743,666 B1 | 6/2014 | Bertero et al. |
| 8,758,912 B2 | 6/2014 | Srinivasan et al. |
| 8,787,124 B1 | 7/2014 | Chernyshov et al. |
| 8,787,130 B1 | 7/2014 | Yuan et al. |
| 8,791,391 B2 | 7/2014 | Bourez |
| 8,795,765 B2 | 8/2014 | Koike et al. |
| 8,795,790 B2 | 8/2014 | Sonobe et al. |
| 8,795,857 B2 | 8/2014 | Ayama et al. |
| 8,800,322 B1 | 8/2014 | Chan et al. |
| 8,811,129 B1 | 8/2014 | Yuan et al. |
| 8,817,410 B1 | 8/2014 | Moser et al. |
| 8,956,741 B1 | 2/2015 | Li et al. |
| 2002/0060883 A1 | 5/2002 | Suzuki |
| 2003/0022024 A1 | 1/2003 | Wachenschwanz |
| 2004/0022387 A1 | 2/2004 | Weikle |
| 2004/0132301 A1 | 7/2004 | Harper et al. |
| 2004/0202793 A1 | 10/2004 | Harper et al. |
| 2004/0202865 A1 | 10/2004 | Homola et al. |
| 2004/0209123 A1 | 10/2004 | Bajorek et al. |
| 2004/0209470 A1 | 10/2004 | Bajorek |
| 2005/0016836 A1 | 1/2005 | Kuo et al. |
| 2005/0036223 A1 | 2/2005 | Wachenschwanz et al. |
| 2005/0142990 A1 | 6/2005 | Homola |
| 2005/0150862 A1 | 7/2005 | Harper et al. |
| 2005/0151282 A1 | 7/2005 | Harper et al. |
| 2005/0151283 A1 | 7/2005 | Bajorek et al. |
| 2005/0151300 A1 | 7/2005 | Harper et al. |
| 2005/0155554 A1 | 7/2005 | Saito |
| 2005/0167867 A1 | 8/2005 | Bajorek et al. |
| 2005/0263401 A1 | 12/2005 | Olsen et al. |
| 2006/0147758 A1 | 7/2006 | Jung et al. |
| 2006/0181697 A1 | 8/2006 | Treves et al. |
| 2006/0207890 A1 | 9/2006 | Staud |
| 2007/0070549 A1 | 3/2007 | Suzuki et al. |
| 2007/0245909 A1 | 10/2007 | Homola |
| 2008/0026255 A1 | 1/2008 | Das et al. |
| 2008/0075845 A1 | 3/2008 | Sonobe et al. |
| 2008/0093760 A1 | 4/2008 | Harper et al. |
| 2009/0117408 A1 | 5/2009 | Umezawa et al. |
| 2009/0136784 A1 | 5/2009 | Suzuki et al. |
| 2009/0147401 A1* | 6/2009 | Takahashi ............ G11B 5/7325 360/125.02 |
| 2009/0169922 A1 | 7/2009 | Ishiyama |
| 2009/0191331 A1 | 7/2009 | Umezawa et al. |
| 2009/0202866 A1 | 8/2009 | Kim et al. |
| 2009/0226764 A1 | 9/2009 | Srinivasan et al. |
| 2009/0311557 A1 | 12/2009 | Onoue et al. |
| 2010/0143752 A1 | 6/2010 | Ishibashi et al. |
| 2010/0190035 A1 | 7/2010 | Sonobe et al. |
| 2010/0196619 A1 | 8/2010 | Ishiyama |
| 2010/0196740 A1 | 8/2010 | Ayama et al. |
| 2010/0209601 A1 | 8/2010 | Shimokawa et al. |
| 2010/0215992 A1 | 8/2010 | Horikawa et al. |
| 2010/0232065 A1 | 9/2010 | Suzuki et al. |
| 2010/0247965 A1 | 9/2010 | Onoue |
| 2010/0261039 A1 | 10/2010 | Itoh et al. |
| 2010/0279151 A1 | 11/2010 | Sakamoto et al. |
| 2010/0300884 A1 | 12/2010 | Homola et al. |
| 2010/0304186 A1 | 12/2010 | Shimokawa |
| 2011/0096432 A1 | 4/2011 | Lu et al. |
| 2011/0097603 A1 | 4/2011 | Onoue |
| 2011/0097604 A1 | 4/2011 | Onoue |
| 2011/0171495 A1 | 7/2011 | Tachibana et al. |
| 2011/0205862 A1 | 8/2011 | Kanbe et al. |
| 2011/0206947 A1 | 8/2011 | Tachibana et al. |
| 2011/0212346 A1 | 9/2011 | Onoue et al. |
| 2011/0223446 A1 | 9/2011 | Onoue et al. |
| 2011/0235479 A1 | 9/2011 | Kanbe et al. |
| 2011/0244119 A1 | 10/2011 | Umezawa et al. |
| 2011/0299194 A1 | 12/2011 | Aniya et al. |
| 2011/0311841 A1 | 12/2011 | Saito et al. |
| 2012/0052330 A1* | 3/2012 | Takekuma ............ G11B 5/84 428/829 |
| 2012/0069466 A1 | 3/2012 | Okamoto et al. |

(56) References Cited

U.S. PATENT DOCUMENTS

| | | |
|---|---|---|
| 2012/0070692 A1 | 3/2012 | Sato et al. |
| 2012/0077060 A1 | 3/2012 | Ozawa |
| 2012/0113768 A1 | 5/2012 | Kanbe et al. |
| 2012/0127599 A1 | 5/2012 | Shimokawa et al. |
| 2012/0127601 A1 | 5/2012 | Suzuki et al. |
| 2012/0129009 A1 | 5/2012 | Sato et al. |
| 2012/0134049 A1* | 5/2012 | Maeda ............ G11B 5/82 360/110 |
| 2012/0140359 A1 | 6/2012 | Tachibana |
| 2012/0141833 A1 | 6/2012 | Umezawa et al. |
| 2012/0141835 A1 | 6/2012 | Sakamoto |
| 2012/0148875 A1 | 6/2012 | Hamakubo et al. |
| 2012/0156523 A1 | 6/2012 | Seki et al. |
| 2012/0164488 A1 | 6/2012 | Shin et al. |
| 2012/0170152 A1 | 7/2012 | Sonobe et al. |
| 2012/0171369 A1 | 7/2012 | Koike et al. |
| 2012/0175243 A1 | 7/2012 | Fukuura et al. |
| 2012/0189872 A1 | 7/2012 | Umezawa et al. |
| 2012/0196049 A1 | 8/2012 | Azuma et al. |
| 2012/0207919 A1 | 8/2012 | Sakamoto et al. |
| 2012/0225217 A1 | 9/2012 | Itoh et al. |
| 2012/0251842 A1 | 10/2012 | Yuan et al. |
| 2012/0251846 A1 | 10/2012 | Desai et al. |
| 2012/0276417 A1 | 11/2012 | Shimokawa et al. |
| 2012/0300600 A1 | 11/2012 | Kanbe et al. |
| 2012/0307398 A1 | 12/2012 | Kanbe et al. |
| 2012/0308722 A1 | 12/2012 | Suzuki et al. |
| 2013/0016591 A1 | 1/2013 | Tomikawa et al. |
| 2013/0040167 A1 | 2/2013 | Alagarsamy et al. |
| 2013/0071694 A1 | 3/2013 | Srinivasan et al. |
| 2013/0165029 A1 | 6/2013 | Sun et al. |
| 2013/0175252 A1 | 7/2013 | Bourez |
| 2013/0194901 A1 | 8/2013 | Kanbe et al. |
| 2013/0208578 A1 | 8/2013 | Kanbe et al. |
| 2013/0216865 A1 | 8/2013 | Yasumori et al. |
| 2013/0230647 A1 | 9/2013 | Onoue et al. |
| 2013/0314815 A1* | 11/2013 | Yuan ............ G11B 5/65 360/59 |
| 2014/0011054 A1 | 1/2014 | Suzuki |
| 2014/0044992 A1 | 2/2014 | Onoue |
| 2014/0050843 A1 | 2/2014 | Yi et al. |
| 2014/0057134 A1 | 2/2014 | Inaba |
| 2014/0064047 A1 | 3/2014 | Niwa et al. |
| 2014/0093748 A1 | 4/2014 | Chen et al. |
| 2014/0134455 A1 | 5/2014 | Bolcavage et al. |
| 2014/0151360 A1 | 6/2014 | Gregory et al. |
| 2014/0234666 A1 | 8/2014 | Knigge et al. |
| 2016/0358622 A1* | 12/2016 | Arora ............ G11B 5/855 |

OTHER PUBLICATIONS

Andrew Bullen, et al., "Thermal Conductivity of Amorphous Carbon Thin Films," J. Appl. Phys. vol. 88, No. 11, Dec. 4, 2000, pp. 6316-6320.

Chen, et al."Structure and Magnetic Properties of L10 FePt Film with Ag Heat Sink Layer," J.Appl.Phys.105, 07B72 (2009), 4 pages.

Yang, et al., "Highly Ordered FePt L1o Thin Films With Small Grains on RuAl Seed Layers", IEEE Transactions on Magnetics, vol. 47, No. 1, pp. 81-86, Jan. 2011, 6 pages.

Yang, et al., "Epitaxial Growth of L1o-FePt Granular Thin Films on TiC/RuAl Underlayers", IEEE Transactions on Magnetics, vol. 47, No. 10, pp. 4077-4079, Oct. 2011, 3 pages.

Shen, et al., "In situ epitaxial growth of ordered FePt (001) films with ultra small and uniform grain size using a RuAl underlayer", Journal of Applied Physics 97, 10H301 (2005) , 3 pages.

Ferrenberg, Alan M. and D. P. Landau, Monte Carlo study of phase transitions in ferromagnetic bilayers, Center for Simulational Physics, The University of Georgia, Athens, Georgia 30602, J. Appl. Phys., vol. 70, No. 10, Nov. 15, 1991, p. 2615-2617.

Sasaki, J. and F. Matsubara, Magnetic properties of mesoscopic ultrathin magnetic films with uniaxial anisotropy, J. Appl. Phys., vol. 87, No. 6, Mar. 15, 2000. pp. 3018-3022.

Thiele, J.-U., K. R. Coffey, M. F. Toney, J. A. Hedstrom, and A. J. Kellock, Temperature dependent magnetic properties of highly chemically ordered $Fe_{55-x}Ni_xPt_{45}$ L10 films, J. Appl. Phys., vol. 91, No. 10, May 15, 2002, pp. 6595-6600.

Cuccoli, Allesandro, Tommaso Roscilde, Valerio Tognetti, Ruggero Vais and Paola Verrucchi, Anisotropy and Ising-type transition of the $S=5/2$ two-dimensional Heisenberg antiferromagnet Mn-formate di-Urea, American Institute of Physics, J. Appl. Phys., vol. 93, No. 10, Parts 2 & 3, May 15, 2003, pp. 7637-7639.

Victora, R. H., Xi Chen and Tao Qu, Temporal Fluctuations of Magnetic Anisotropy and their Impact on HAMR Media Noise, The Center for Micromagnetics and Information Technologies, Aug. 18, 2010.

Tomoko Seki, et al., U.S. Appl. No. 14/096,332, filed Dec. 4, 2013, 20 pages.

Shunji Takenoiri, et al., "Structural Control Method for Perpendicular Magnetic Recording Film," Fuji Electric Review, vol. 50, No. 3, pp. 81-84.

* cited by examiner

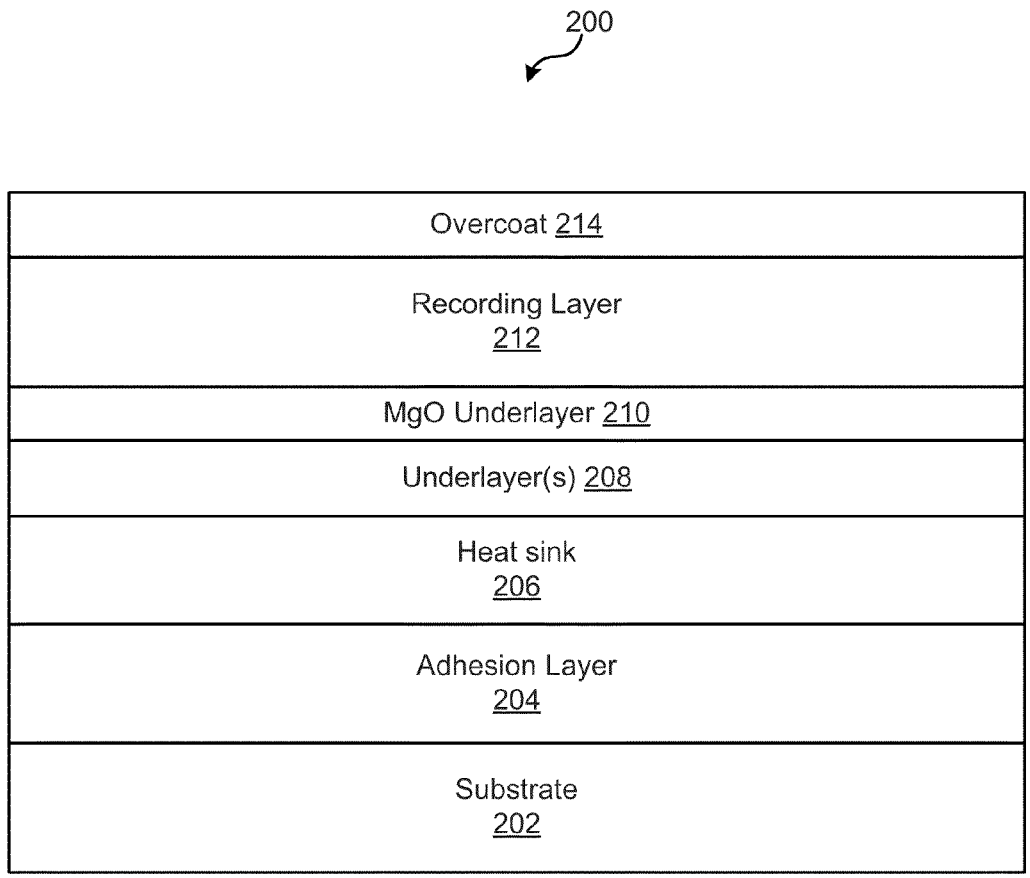
FIG. 2
(Conventional)

IRIDIUM UNDERLAYER FOR HEAT ASSISTED MAGNETIC RECORDING MEDIA

BACKGROUND

For all types of substrates, magnetic recording media has begun to incorporate perpendicular magnetic recording (PMR) technology in an effort to increase areal density. Generally, PMR media may be partitioned into two primary functional regions: a soft underlayer (SUL) and a magnetic recording layer(s) (RL). FIG. 1 illustrates portions of a conventional PMR disk drive system having a recording head 101 including a trailing write pole 102 and a leading return (opposing) pole 103 magnetically coupled to the write pole 102. An electrically conductive magnetizing coil 104 surrounds the yoke of the write pole 102. The bottom of the opposing pole 103 has a surface area greatly exceeding the surface area of the tip of the write pole 102. As the magnetic recording disk 105 is rotated past the recording head 101, current is passed through the coil 104 to create magnetic flux within the write pole 102. The magnetic flux passes from the write pole 102, through the magnetic recording disk 105, and across to the opposing pole 103 to record in the PMR layer 150. The SUL 110 enables the magnetic flux from the trailing write pole 102 to return to the leading opposing pole 103 with low impedance.

With the advent of heat-assisted magnetic recording (HAMR) media, areal density in hard disk drives can be extended beyond 1.5 Tb/in$^2$. However, superparamagnetic limits, thermal stability, and writability issues can limit the ability to increase areal densities in hard disk drives using conventional PMR media. Thus, and in order to support higher areal densities while also providing thermal stability, HAMR media is often made of magnetic materials or compounds with substantially higher magnetocrystalline anisotropy (indicated by the magnetic anisotropy constant, $K_u$) than that of non-HAMR media (e.g., Cobalt-Chromium-Platinum (CoCrPt) alloys). One example of such an alloy having substantially higher magnetocrystalline anisotropy is the $L1_0$ phase of Iron-Platinum (FePt) alloys. In principle, the higher $K_u$ of $L1_0$ FePt allows grains as small as 2-5 nm to remain thermally stable. Unlike CoCrPt alloys however, the growth of chemically ordered $L1_0$ FePt requires a deposition temperature greater than 400° C. Moreover, due to the limitations in available writing fields, a write assist mechanism, such as HAMR is needed for high $K_u$ media. Additionally still, HAMR media with a SUL typically has a wider magnetic write width (MWW) than media without a SUL, thereby limiting its areal density capabilities.

Because HAMR media is made of higher-stability magnetic compounds, as described above, HAMR media relies upon the application of heat to achieve changes in magnetic orientation. HAMR media is temporarily heated to reduce its coercivity below that of an applied magnetic write field from a recording head, i.e., the temperature of the recording location on the HAMR media is increased in order to sufficiently lower the location's $K_u$ to allow a change to its magnetic orientation (i.e., record data). This allows for higher media anisotropy and smaller thermally stable grains.

BRIEF DESCRIPTION OF THE DRAWINGS

Various embodiments are illustrated by way of example, and not limitation, in the figures of the accompanying drawings in which:

FIG. 2 illustrates a cross-sectional view of an example media structure in which a conventional MgO underlayer is utilized;

DETAILED DESCRIPTION

Figure 1:
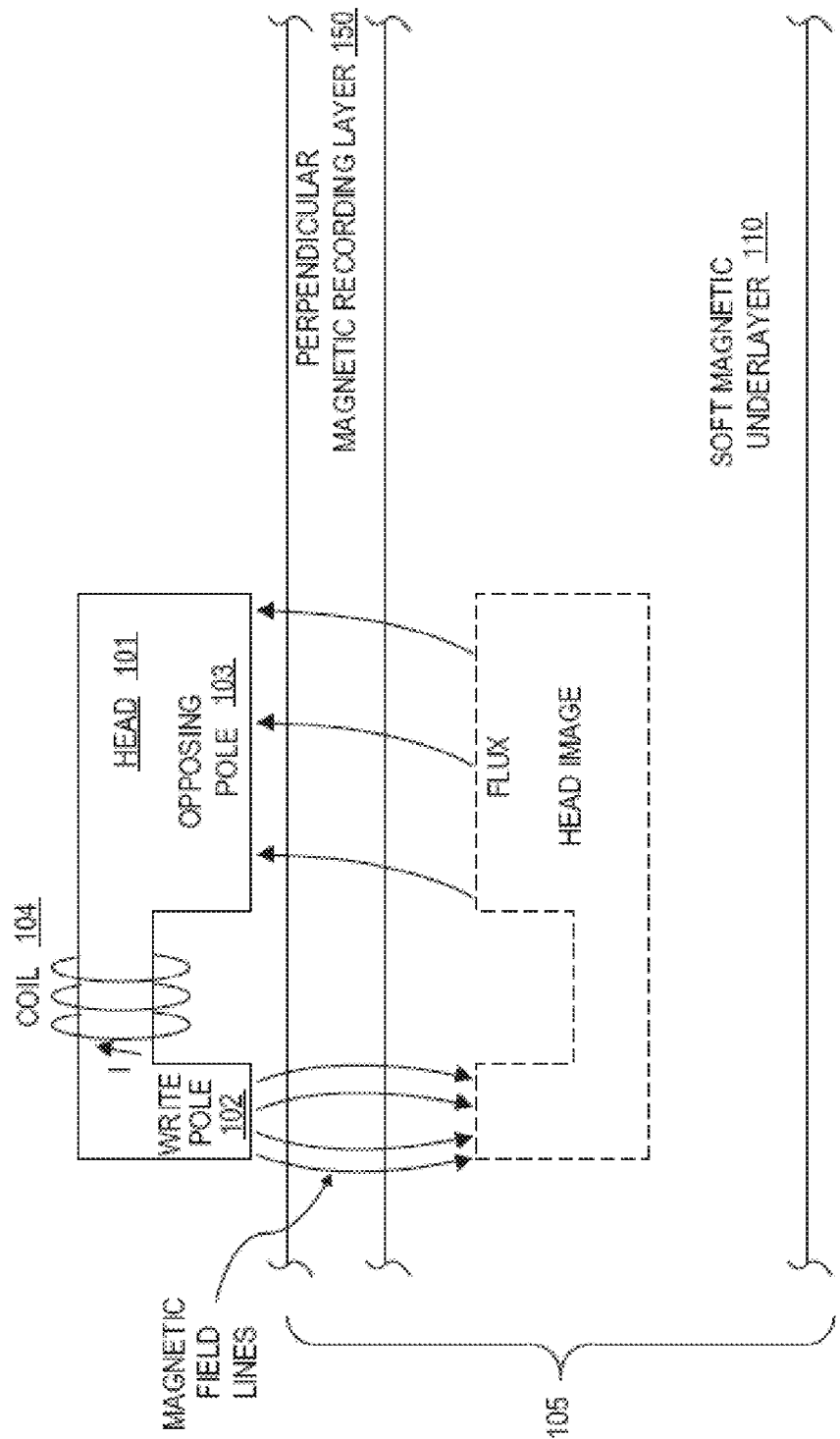
FIG. 1 illustrates an example conventional PMR disk drive system.

In the following description, numerous specific details are set forth to provide a thorough understanding of various embodiment of the present disclosure. It will be apparent to one skilled in the art, however, that these specific details need not be employed to practice various embodiments of the present disclosure. In other instances, well known components or methods have not been described in detail to avoid unnecessarily obscuring various embodiments of the present disclosure.

As alluded to previously, characteristics such as small grain size and weak exchange coupling are desirable in ultra high-density magnetic recording media (of which HAMR media is an example). The reduced coercivity of HAMR media at elevated temperatures provides a solution to the fundamental constraint of "writability versus thermal stability" as magnetic recording scales down. Once the "writability versus thermal stability" constraint is broken, the magnetic recording density is expected to grow as grain size scales down. Accordingly, HAMR media, such as $L1_0$ FePt, provide anisotropy strong enough for stable storage at room temperature. This enables HAMR media to maintain high thermal stability and overcome superparamagnetic limits even at grain sizes below 3 nm. This is in contrast to, e.g., PMR recording media, which relies on lower temperature processes, and thus does not generally result in FePt (or Iron Palladium (FePd) or Cobalt Platinum (CoPt)) films with a highly ordered $L1_0$ structure.

To obtain the desired highly perpendicular anisotropy in the magnetic recording layer, crystallographic orientation of magnetic grain should be controlled by proper underlayer selection. The underlayer also acts as a diffusion barrier in order to keep external atoms from diffusing into the magnetic recording layer which might otherwise destroy the magnetic properties of the magnetic recording layer. A conventional example of an underlayer is one comprising Magnesium Oxide (MgO) to provide an orientation control layer and act as a diffusion barrier.

FIG. 2 illustrates a cross-sectional view of an example media structure 200 including a conventional MgO underlayer. It should be noted that the term media structure can refer to an entire recording medium stack, as is described and illustrated in accordance with various embodiments herein.

Media structure 200 may include the following: a substrate 202; an adhesion layer 204; a heat sink layer 206; a first underlayer 208; a second underlayer 210; a recording layer 212; an overcoat 214; and a lubricant layer 216. Substrate 202 may be, e.g., a high temperature glass, metal, and/or metal alloy material. In one embodiment, substrate 202 can be disk-shaped or annular. Glass substrates that may be used include, for example, high temperature glass, a silica-containing glass such as borosilicate glass and aluminosilicate glass. Metal and metal alloy substrates that may be used include, for example, aluminum (Al), tantalum (Ta), and aluminum magnesium (AlMg) substrates, such as Nickel-Phosphorus (NiP)-plated AlMg. In an alternative embodiment, other substrate materials such as polymers and ceramics, such as amorphous glass, may be used, as well as sapphire, quartz, canasite, and Silicon Carbide (SiC).

Adhesion layer 204, which can be an alloy material, such as, e.g., a Nickel Tantalum alloy (Ni—Ta), may be disposed over substrate 202. Heat sink layer 206 can be configured to specifically facilitate heat transfer for the HAMR media. In accordance with one embodiment, heat sink layer 206 may be one or more of Silver (Ag), Aluminum (Al), Gold (Au), Copper (Cu), Cr, Molybdenum (Mo), Tungsten (W), Ruthenium Cobalt (RuCo), Copper Silicon (CuSi), CuAo, CuNi, Copper Tin (CuSn), Ru, Copper Zirconium (CuZr), Molybdenum Copper (MoCu), CuFeCo, CuNiFe, Silver Palladium (AgPd), CrRu, CrV, CrW, CrMo, CrNd, Ru—SiO2, Ruthenium-Titanium Dioxide (Ru—TiO2), Ru—CoO, W—SiO2, W—TiO2, and W—CoO. Moreover, heat sink layer 206 may have a thermal conductivity value greater than 100 $W \cdot m^- \cdot K^{-1}$.

As alluded to previously, underlayer 208 can be an alloy for promoting proper/desired texture in the magnetic recording layer. In accordance with various embodiments, an underlayer (whether a single layer underlayer, laminated underlayer, or multiple laminated layer underlayer) may be one of a Co or CoFe material having at least one additive, the at least one additive comprising Ni, Zr, Boron (B), Ta, W, or Mo. Such Co or CoFe materials may have also varying compositions due to the amounts of each material(s) included therein, e.g., 20 to 90% Co, 0 to 60% Fe, 0- to 20% Ni, 0 to 20% Zr, 0 to 15% B, 0 to 20% Ta, 0 to 10% W, and 0 to 10% Mo.

Accordingly, underlayer 208 can be, e.g., a CoFe-based alloy such a Co—Fe—Zr—B—W alloy in accordance with one embodiment. In accordance with another embodiment, underlayer 208 can be, e.g., a Co—Fe—Ta—B alloy.

Further still, an additional underlayer material is chosen such that inter-diffusion does not occur at these high temperatures. As previously discussed, this layer 210 can be, e.g., Magnesium Oxide (MgO). MgO lends itself to use in HAMR media due to its high melting point. MgO has a melting point of 2852° C., and accordingly, can avoid inter-diffusion in the context of HAMR media, in particular, resistance to the temperatures required for HAMR media growth/processing and writing. Additionally, MgO shows negligible diffraction contrast, indicating that MgO has an amorphous microstructure even after annealing at high temperatures, e.g., 550° C.

Disposed over MgO underlayer 210, is recording layer 212, which may be, as previously alluded to, an $L1_0$ FePt, FePt, FePd, CoPt, or MnAl magnetic recording layer, or a Cobalt Platinum (CoPt) or Cobalt Palladium (CoPd) multilayer alloy having a predetermined/preferred thickness, granular structure, small grain size, desired uniformity, high coercivity, high magnetic flux, and good atomic ordering, as would be appropriate for HAMR media. Other additive elements may be added to the aforementioned alloy recording layer 318 including, e.g., Ag, Au, Cu, or Ni.

Further still, overcoat layer 214 may be formed on top of recording layer 212 to, e.g., meet tribological requirements, such as contact-start-stop (CSS) performance and corrosion protection. Materials that can be utilized for overcoat layer 214 may be, e.g., carbon-based materials, such as hydrogenated or nitrogenated carbon.

However, utilizing MgO as an underlayer can present certain issues. For example, MgO is an electrical insulator having high resistivity, thus requiring radio-frequency (RF) sputtering to be used, which can be a less-desirable method of sputtering compared to direct-current (DC) sputtering, which may only be used to deposit conducting materials. Additionally, MgO has a low deposition rate, resulting in lower total production yields during manufacturing, and during the MgO deposition process, particle contamination can often be generated. Such particles can destroy the recording media and is difficult to clean. Further still, there is little control over the morphology and structure of MgO by changing deposition conditions, because the morphology and structure is determined by the intrinsic properties of MgO.

Accordingly, various embodiments provide a media structure in which Iridium (Ir)-based materials may be utilized as a secondary underlayer instead of MgO. Such Ir-based materials may include, e.g., pure Ir, Ir-based alloys, Ir-based compounds, as well as a granular Ir layer with segregants. Examples of Ir-based alloys that can be utilized in accordance with various embodiments may include, e.g., IrTi, IrZr, and IrC.

Thus, an Ir-based material can act as an orientation control layer and a diffusion barrier while avoiding the aforementioned issued associated with the use of MgO. For example, Ir is a conductive metal, thereby allowing for the use of DC sputtering for depositing the Ir or Ir-based material(s). It should be noted that the use of DC sputtering is preferred over RF sputtering as the deposition of the majority or all of the layer materials already utilize DC sputtering to deposit them on the media stack resulting in, e.g., more efficient and simple manufacturing processes, not to mention the ability to avoid the finer control often necessitated by the use of RF sputtering. The deposition rate of Ir is also relatively, high, i.e. more than 8 times higher than that of MgO, resulting in better production yields during manufacturing. Moreover, fewer particles are generated during Ir-based layer deposition processes, and in fact, an Ir/Ir-based underlayer can act as a better heat sink than MgO. Further still, the morphology and structure of a recording layer deposited on an Ir-based layer can be better controlled by at least one of adding an alloying element, adding segregants, forming Ir-based compounds, and changing deposition parameters.

Figure 3:
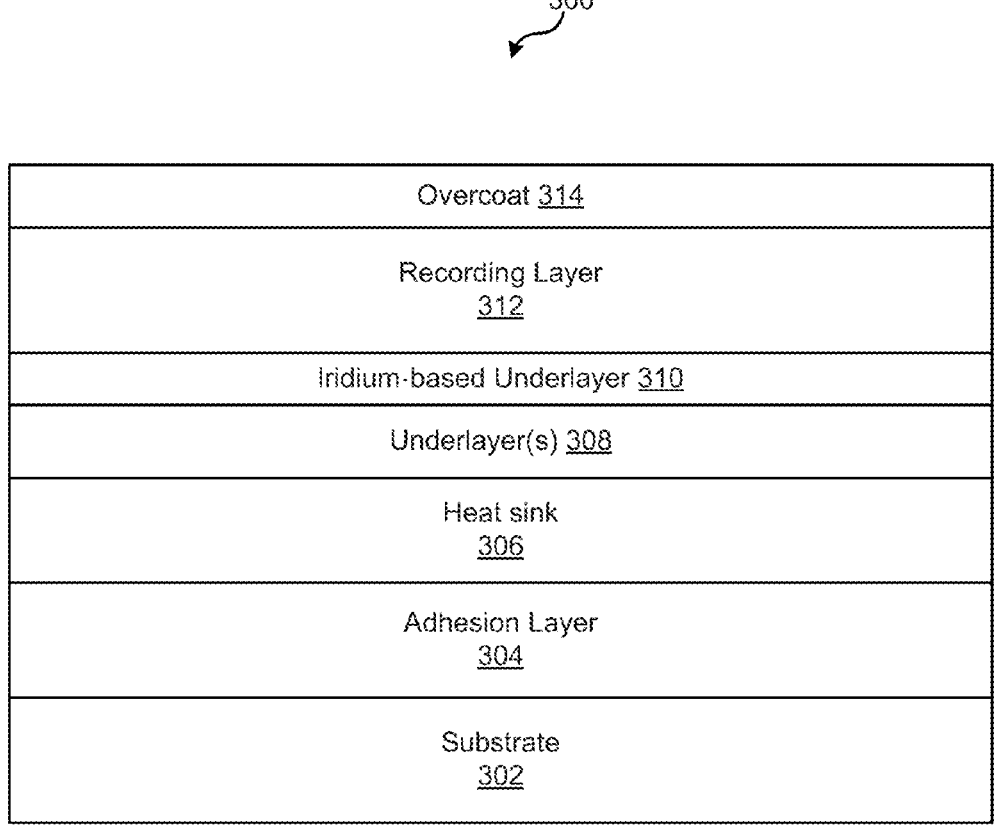
FIG. 3 illustrates a cross-sectional view of an example media structure including an Iridium-based underlayer in accordance with various embodiments.

FIG. 3 illustrates a cross-sectional view of an example media structure 300 including an Ir-based material underlayer in accordance with various embodiments. Media structure 300 may include the following: a substrate 302; an adhesion layer 304; a heat sink layer 306; an underlayer 308; an Ir-based underlayer 310; a recording layer 312; and an overcoat 314. Substrate 302 may be, e.g., a high temperature glass, metal, and/or metal alloy material that can withstand such temperatures, e.g., in the range of approximately 400° C.-750° C. In one embodiment, substrate 302 can be disk-shaped or annular. Glass substrates that may be used include, for example, high temperature glass, a silica-containing glass such as borosilicate glass. Other high temperature metals and metal alloy substrates may be used include, for example, aluminum magnesium (AlMg) substrates, Nickel-Phosphorus (NiP)-plated AlMg, etc. In an alternative embodiment, other substrate materials such as polymers and ceramics, such as amorphous glass, may be used, as well as sapphire, quartz, canasite, and Silicon Carbide (SiC).

Adhesion layer 304, which can be an alloy material, such as, e.g., a Nickel Tantalum alloy (Ni—Ta), may be disposed over substrate 302.

Heat sink layer 306 can be configured to specifically facilitate heat transfer for the HAMR media. In accordance with one embodiment, heat sink layer 206 may be one or more of Ag, Al, Au, Cu, Cr, Mo, W, RuCo, CuSi, CuAl, CuNi, CuSn, Ru, CuZr, MoCu, CuFeCo, CuNiFe, AgPd, CrRu, CrV, CrW, CrMo, CrNd, Ru—SiO2, Ru—TiO2, Ru—CoO, W—SiO2, W—TiO2, and W—CoO. Moreover, heat sink layer 306 may have a thermal conductivity value greater than 100 $W \cdot m^{-1} \cdot K^{-1}$. It should be noted that as alluded to previously, conventional PMR designs may rely on recording media structure that is predominantly $L1_0$, where approximately 60 to 80% ordering is acceptable. In other words, with such a structure, the requisite anisotropy is sufficiently optimized for writing in a conventional PMR system. However, in the HAMR context, in which the various embodiments disclosed herein are applied, recording media with significantly higher "quality," e.g., FePt $L1_0$ with approximately 98% or greater occurrence of correctly oriented grains, is desirable. Writing on recording media with this higher anisotropy cannot be performed with conventional PMR recording media. Heat sink layer 306 is deposited below underlayer 308 and pure-Ir/Ir-based underlayer 310 to control heat flow and maintain a high thermal gradient in recorder layer 312. Segregants in layers 308-312 can be selected in accordance with their ability to absorb light and heat in order to obtain high quality writing and SNR.

Underlayer 308 can be a single layer underlayer, laminated underlayer, or multiple laminated layer underlayer, and may be a body-centered-cubic (BCC) underlayer, such as one of a Co or CoFe material having at least one additive, the at least one additive comprising Ni, Zr, Boron (B), Ta, W, or Mo. Such Co or CoFe materials may have also varying compositions due to the amounts of each material(s) included therein, e.g., 20 to 90% Co, 0 to 60% Fe, 0 to 20% Ni, 0 to 20% Zr, 0 to 15% B, 0 to 20% Ta, 0 to 10% W, and 0 to 10% Mo. In one embodiment, underlayer 308 can include an Ag layer and another alloy layer comprising 70% Cr, 10% Zr, 10% W, and 10% Mo. Underlayer 308 can be used for growing the Ir-based underlayer 310 with the correct crystallographic texture and to act as a thermal resistor during the (bit) writing process.

As described above, an Ir-based underlayer 310 can be deposited on underlayer 308 to act as an orientation control layer and diffusion barrier. It should be noted that Ir-based materials are proven to be immiscible with, e.g., FePt and control (001) orientation of the FePt magnetic recording layer.

Disposed over Ir-based underlayer 310, is recording layer 312, which may be, as previously alluded to, an $L1_0$ FePt, FePt, FePd, CoPt, or MnAl magnetic recording layer, or a Cobalt Platinum (CoPt) or Cobalt Palladium (CoPd) multi-layer alloy having a predetermined/preferred thickness, granular structure, small grain size, desired uniformity, high coercivity, high magnetic flux, and good atomic ordering, as would be appropriate for HAMR media. Other additive elements may be added to the aforementioned alloy recording layer 318 including, e.g., Ag, Au, Cu, or Ni.

Further still, overcoat layer 314 may be formed on top of recording layer 212 to, e.g., meet tribological requirements, such as contact-start-stop (CSS) performance and corrosion protection. Materials that can be utilized for overcoat layer 314 may be, e.g., carbon-based materials, such as hydrogenated or nitrogenated carbon.

Figure 4:
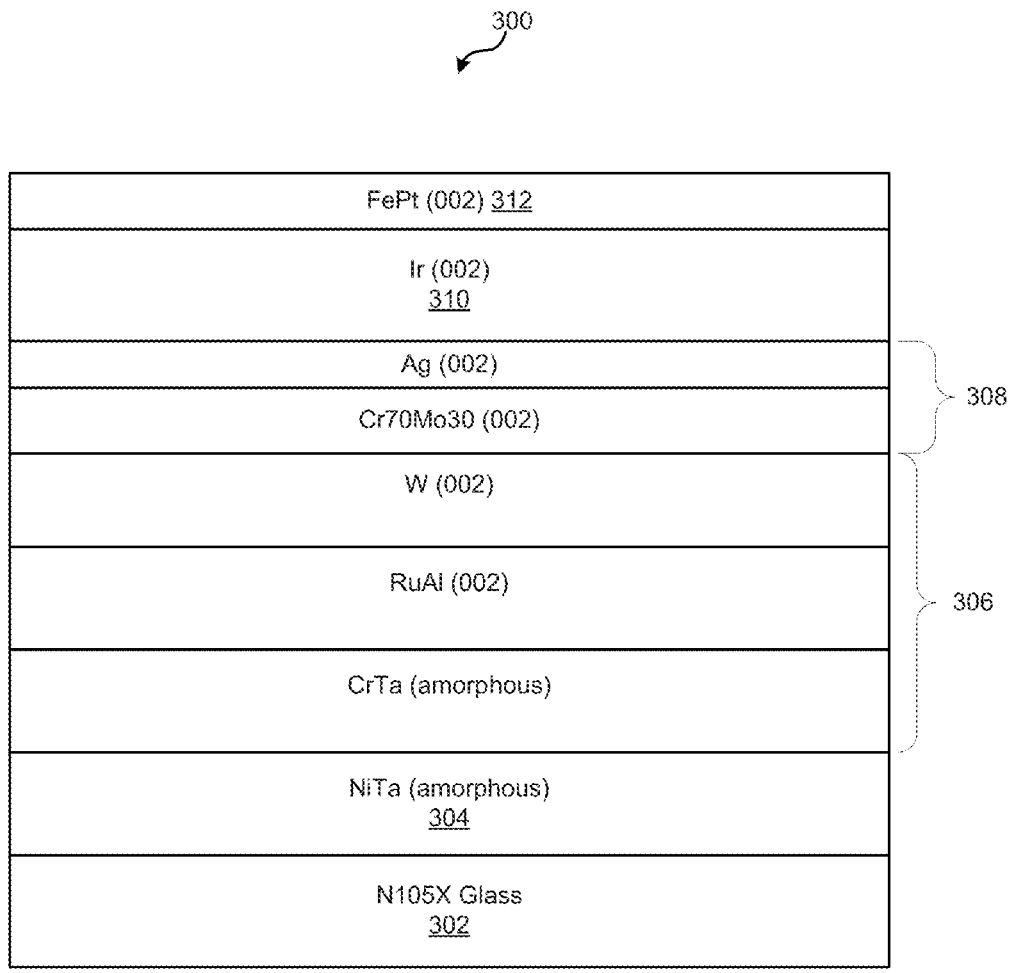
FIG. 4 illustrates a cross-sectional view of the example media structure of FIG. 3 including example layer materials.

FIG. 4 illustrates the example media structure of FIG. 3 including the particular layer materials used in accordance with one embodiment. In particular, substrate 302 may be a N105X glass substrate. Adhesion layer 304 may comprise amorphous NiTa. Heat sink layer 306 may comprise multiple layers including amorphous CrTa, (002) RuAl, and (002) W. It should be noted that the "(002)" designation is an indication of the respective crystallographic orientations of the materials.

Moreover, layers (002) Ag and (002) Cr70Mo30 can be a first underlayer 308 and the second layer 310 may be (002) Ir. The magnetic recording layer 312, as discussed previously, may be (002) FePt.

Figure 5A:
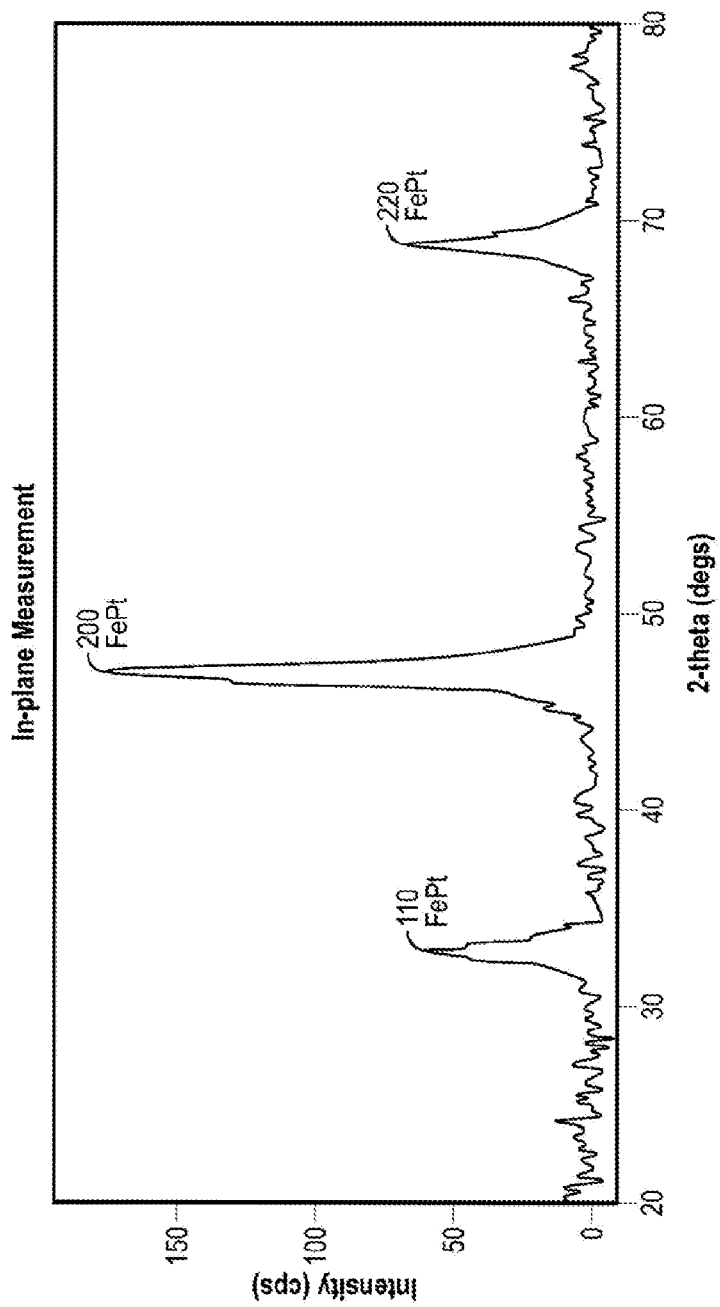
FIG. 5A is a an XRD micrograph depicting the in-plane XRD patterns of FePt on an Iridium-based underlayer.
Figure 5B:
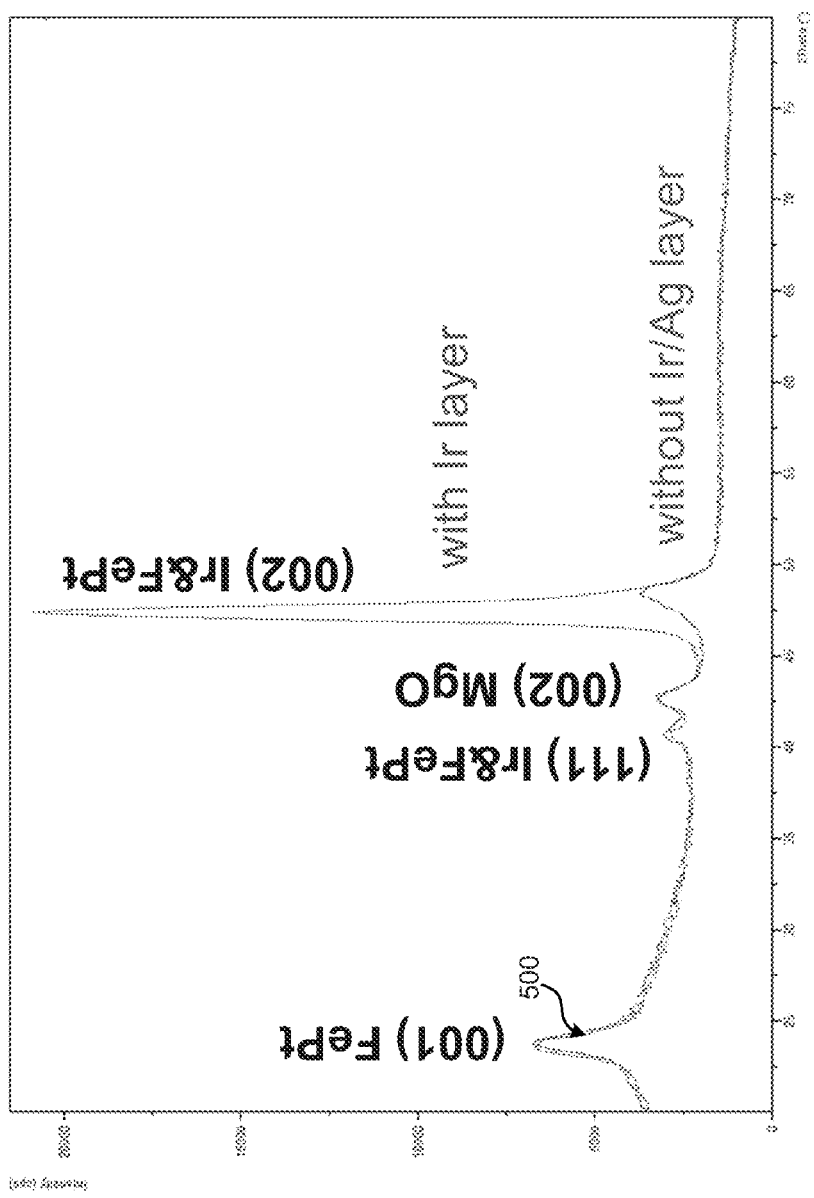
FIG. 5B is a an XRD micrograph depicting the out-of-plane XRD patterns of FePt on an Iridium-based underlayer.

The ability of an Ir-based underlayer to control the orientation of a magnetic recording layer such as FePt or CoPt can be seen by the in-plane X-ray diffraction (XRD) measurements shown in FIG. 5A. In particular, FIG. 5A provides the results of in-plane XRD 2θ scans of (110), (200), and (220) oriented FePt magnetic recording layers, where generally, the higher the peak intensity, the better the crystallinity, and the narrower the rocking curve Full Width Half Maximum (FWHM) value, the better the texture. In this case, use of Ir or an Ir-based underlayer results in good FePt texture. It can also be observed that there is no (001) FePt peak suggestive of desired out of plane orientation. In contrast, FIG. 5B illustrates an example out-of-plane XRD 2θ scans of (001) oriented FePt, (111) and (002) oriented Ir and FePt. As shown at 500, there is no appreciable change in the degree of ordering, and the peak is much greater with an Ir underlayer than without as shown by the (002) Ir and FePt peaking. By comparison, when using MgO as an underlayer, e.g., 10% of the grains grow in-plane which is undesirable for recording. Here, there is no/negligible undesirable in-plane growth of FePt.

Figure 6:
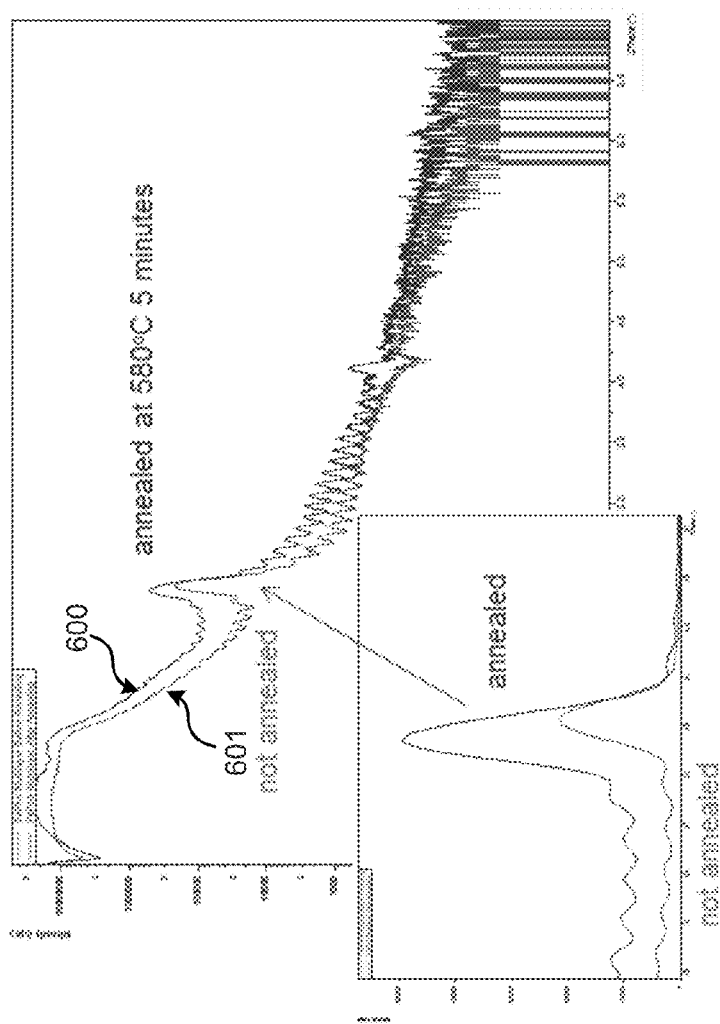
FIG. 6 is an example graph illustrative of X-Ray reflectivity measurements showing the immiscibility of the Iridium-based underlayer.

It should also be noted that the FePt does not diffuse with the Ir/Ir-based underlayer, thereby maintaining the lattice structure even after annealing. As illustrated in FIG. 6, which is an example X-ray reflectivity measurement of an Ir—FePt film stack, the superlattice peaks become stronger post-annealing (line 600) compared to pre-annealing (line 601), indicating that Ir and FePt are immiscible. Therefore, and again, Ir or Ir-based materials would be a suitable diffusion barrier.

Figure 7:
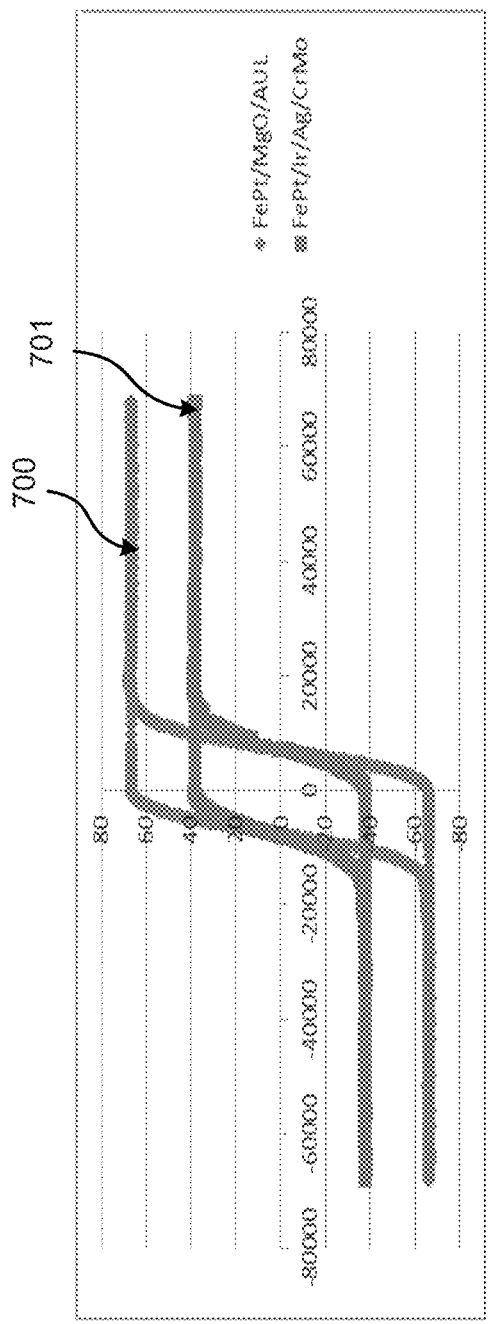
FIG. 7 is an example chart illustrating the impact of using an Iridium-based underlayer in accordance with various embodiments.

FIG. 7 compares an example hysteresis loop in Polar Kerr measurement of a conventional FePt—MgO media structure 700 with that of a FePt—Ir media structure 701. As can be appreciated by the example measurement, the coercivity of the FePt—MgO media structure is approximately 7500 Oe, and this does not change/decrease with the use of Ir/Ir-based materials in place of MgO. That is, there is no appreciable degradation of the magnetic properties of a FePt—Ir media structure when compared to a FePt—MgO media structure, leading to near-identical magnetic properties between the two media structures. It should be further noted that use of an Ir-based underlayer can result in, e.g., a lower magentoresistive ratio (MR) (indicative of the amount of hard axis that is magnetically in line with the in-plane direction in the FePt layer), than when utilizing an MgO underlayer by approximately 10% due to well-controlled texture.

Figure 8:
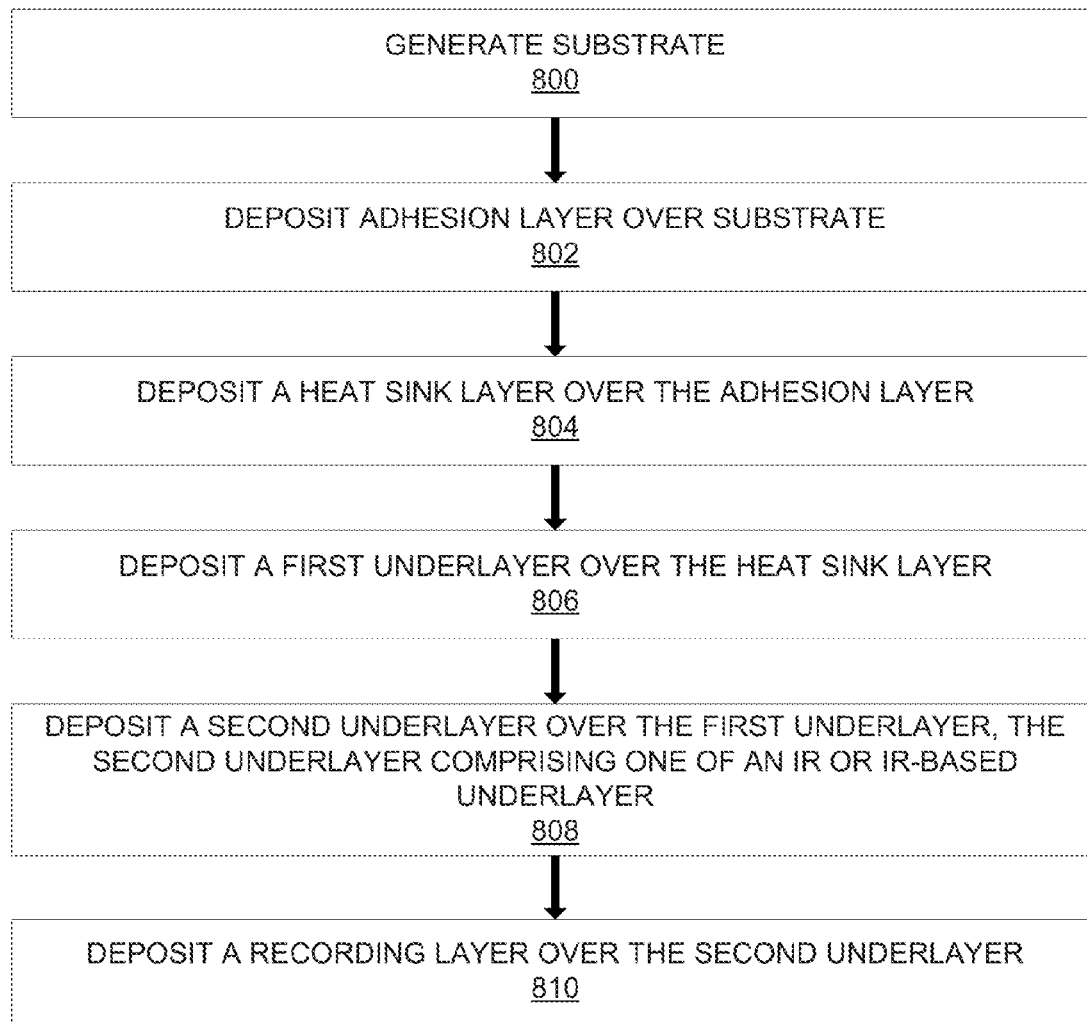
FIG. 8 is a flow chart of example processes performed for manufacturing a HAMR disk utilizing an Iridium-based underlayer in accordance with various embodiments.

FIG. 8 is a flow chart illustrating example processes for manufacturing a HAMR disk in accordance with various embodiments. At 800, a substrate is generated or otherwise provided. As previously discussed, the substrate may be a glass substrate. At 802, an adhesion layer is deposited over the substrate. At 804, a heat sink layer is deposited over the adhesion layer. At 806, a first underlayer is deposited over the heat sink layer. At 808, a second underlayer is deposited over the first underlayer, the second underlayer comprising one of an Ir or Ir-based underlayer. At 810, a recording layer is deposited over the underlayer.

It should be noted that the use of an Ir or Ir-based underlayer in accordance with various embodiments can done in the context of granular media (e.g., with segregants) that is not necessarily limited by domain wall motion at the pinning site. Moreover, various embodiments result in relatively smooth recording media (without additional chemical etching processes needed), air-gap-less grains that are mechanically more stable than that of conventional recording media, and do not necessitate considering contact between the magnetic recording layer and an underlayer residing below the Ir/Ir-based underlayer. Further still, the aforementioned media structure can be applied on BCC-based underlayer materials, (not only, e.g., on a Cu underlayer) to control orientation.

Figure 9:
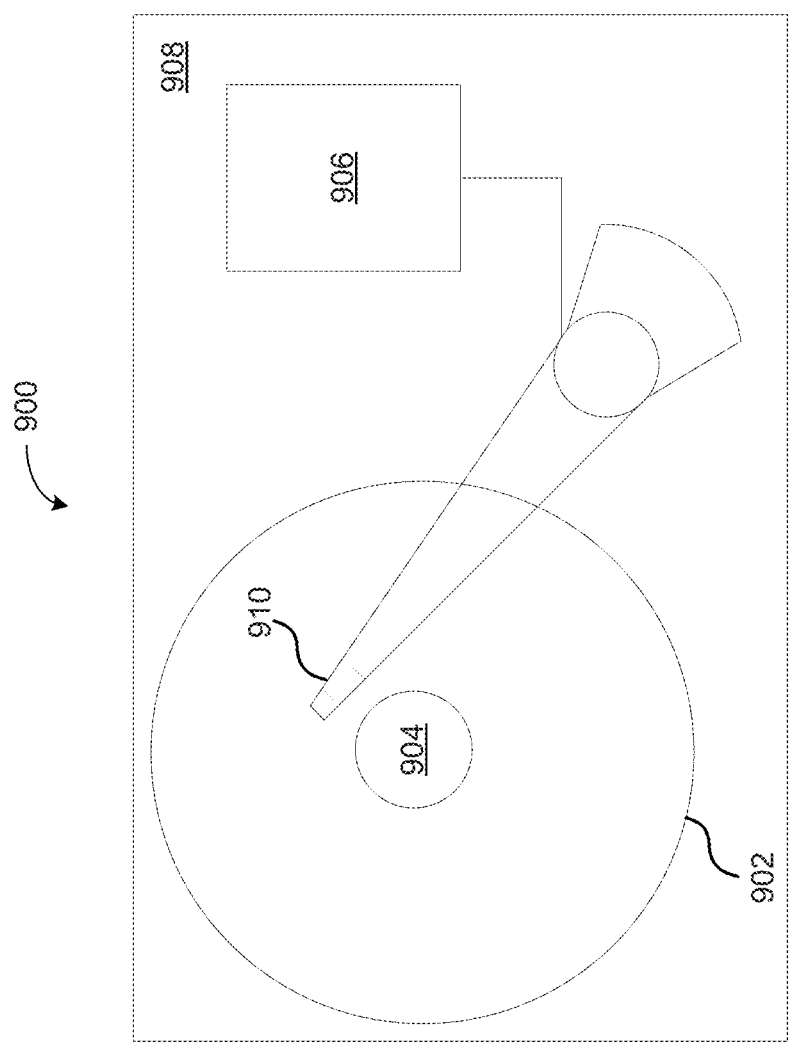
FIG. 9 illustrates an example disk drive in which a HAMR disk utilizing an Iridium-based underlayer in accordance with various embodiments can be implemented.

FIG. 9 illustrates a disk drive 900 having one or more disks 902. Disk 902 resides on a spindle assembly 904 that is mounted to drive housing 908. Data may be stored along tracks in the magnetic recording layer of disk 902. The reading and writing of data is accomplished with head 910 that has both read and write elements. The write element is used to alter the properties of the perpendicular magnetic recording layer of disk 902. In one embodiment, head 910 may have MR, or giant magneto-resistive (GMR) elements. In an alternative embodiment, head 910 may be another type of head, for example, an inductive read/write head or a Hall effect head. In some embodiments, disk 902 has a media structure as depicted in FIGS. 3 and 4, and disk drive 900 is a heat assisted magnetic recording (HAMR) drive and incorporate components of a laser source, a waveguide, and a near-field transducer (not shown). Techniques in generating and focusing a laser beam are known in the art, and thus, are not described in particular detail. A spindle motor (not shown) rotates spindle assembly 904 and, thereby, disk 902 to position head 910 at a particular location along a desired disk track. The position of head 910 relative to disk 902 may be controlled by position control circuitry 906.

Although described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the application, whether or not such embodiments are described and whether or not such features are presented as being a part of a described embodiment. Thus, the breadth and scope of the present application should not be limited by any of the above-described exemplary embodiments.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A heat-assisted magnetic recording medium, comprising:
    a substrate;
    an adhesion layer deposited over the substrate;
    a heat sink layer deposited over the adhesion layer;
    a first underlayer deposited over the heat sink layer, the first underlayer comprising a body-centered-cubic Co-based material or a body-centered cubic CoFe-based material;
    a second underlayer deposited directly over the first underlayer, the second underlayer comprising an Ir-based material; and
    a magnetic recording layer for storing data via heat-assisted magnetic recording deposited over the second underlayer.

2. The heat-assisted magnetic recording medium of claim 1, further comprising an overcoat layer disposed over the magnetic recording layer.

3. The heat-assisted magnetic recording medium of claim 2, wherein the overcoat layer comprises one of hydrogenated or nitrogenated carbon.

4. The heat-assisted magnetic recording medium of claim 1, wherein the first underlayer includes an additive comprising at least one of Ni, Zr, B, Ta, W, or Mo.

5. The heat-assisted magnetic recording medium of claim 1, wherein the heat sink layer comprises (002) Tungsten (W), (002) Ruthenium Aluminide (RuAl), and amorphous Chromium Tantalum (CrTa).

6. The heat-assisted magnetic recording medium of claim 1, wherein the adhesion layer comprises amorphous Nickel-Tantalum (Ni—Ta).

7. The heat-assisted magnetic recording medium of claim 1, wherein the substrate comprises one of a glass, metallic, polymer, or ceramic material capable of withstanding temperatures of at least approximately 400° C.-750° C.

8. The heat-assisted magnetic recording medium of claim 1, wherein the magnetic recording layer is an alloy comprising (001) Iron-Platinum (FePt).

9. The heat-assisted magnetic recording medium of claim 1, wherein the Ir-based material comprises one of pure Ir, an Ir-based alloy, an Ir-based compound, and a granular Ir layer with segregants.

10. The heat-assisted magnetic recording medium of claim 9, wherein the Ir-based alloy comprises one of an Iridium Titanium (IrTi) alloy, an Iridium Zirconium (IrZr) alloy, or an Iridium Carbon (IrC) alloy.

11. The heat-assisted magnetic recording medium of claim 9, wherein the segregants comprise at least one of light and heat absorbing materials.

12. A method, comprising:
generating or providing a substrate;
depositing an adhesion layer over the substrate;
depositing a heat sink layer over the adhesion layer;
depositing a first underlayer over the heat sink layer, the first underlayer comprising a body-centered-cubic Co-based material or a body-centered cubic CoFe-based material;
depositing a second underlayer directly over the first underlayer, the second underlayer comprising an or Ir-based material; and
depositing a recording layer over the second underlayer.

13. The method of claim 12, wherein the substrate comprises one of a glass, metallic, polymer, or ceramic material capable of withstanding temperatures of at least approximately 400° C.-750° C.

14. The method of claim 12, wherein the adhesion layer comprises amorphous Nickel-Tantalum (Ni—Ta), and wherein the heat sink layer comprises (002) Tungsten (W), (002) Ruthenium Aluminide (RuAl), and amorphous Chromium Tantalum (CrTa).

15. The method of claim 12, wherein the recording layer is a heat-assisted magnetic recording (HAMR) recording layer.

16. The method of claim 12, wherein the recording layer is an alloy comprising (001) Iron-Platinum (FePt).

17. The method of claim 16, wherein the (001) Iron-Platinum (FePt) alloy comprises a (001) Iron-Platinum (FePt) film having at least a 98 percent correct grain orientation structure.

18. The method of claim 12, wherein the Ir-based material comprises one of an Ir-based alloy, an Ir-based compound, and a granular Ir layer with segregants.

19. The method of claim 18, wherein the Ir-based alloy comprises one of an Iridium Titanium (IrTi) alloy, an Iridium Zirconium (IrZr) alloy, or an Iridium Carbon (IrC) alloy.

20. The method of claim 18, wherein the segregants comprise at least one of light and heat absorbing materials.

\* \* \* \* \*